(12) United States Patent
Inada et al.

(10) Patent No.: US 9,461,276 B2
(45) Date of Patent: Oct. 4, 2016

(54) ORGANIC ELECTROLUMINESCENCE DEVICE AND METHOD OF FABRICATING THE SAME

(71) Applicant: Panasonic Corporation, Osaka (JP)

(72) Inventors: Yasuhisa Inada, Osaka (JP); Taku Hirasawa, Kyoto (JP); Shinichi Wakabayashi, Osaka (JP); Masahito Yamana, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 31 days.

(21) Appl. No.: 14/038,143

(22) Filed: Sep. 26, 2013

(65) Prior Publication Data

US 2014/0027748 A1 Jan. 30, 2014

Related U.S. Application Data

(63) Continuation of application No. PCT/JP2013/000168, filed on Jan. 16, 2013.

(30) Foreign Application Priority Data

Jan. 19, 2012 (JP) ................... 2012-009436

(51) Int. Cl.
*H01L 51/52* (2006.01)
*H01L 51/56* (2006.01)

(52) U.S. Cl.
CPC ....... *H01L 51/5275* (2013.01); *H01L 51/5218* (2013.01); *H01L 51/5221* (2013.01); *H01L 51/56* (2013.01); *H01L 2251/558* (2013.01)

(58) Field of Classification Search
CPC .................................................. H01L 51/5275
USPC ............................................ 257/40; 438/29
See application file for complete search history.

(56) References Cited

U.S. PATENT DOCUMENTS 6,777,706 B1    8/2004  Tessler et al.
7,548,021 B2 *  6/2009  Cok et al. ................ 313/506
(Continued)

FOREIGN PATENT DOCUMENTS

CN    1316105      10/2001
CN    102272973    12/2011
(Continued)

OTHER PUBLICATIONS

International Search Report issued in International Application No. PCT/JP2013/000168 on May 7, 2013.
(Continued)

*Primary Examiner* — Kenneth Parker
*Assistant Examiner* — Warren H Kilpatrick
(74) *Attorney, Agent, or Firm* — Wenderoth, Lind & Ponack, L.L.P.

(57) ABSTRACT

An organic EL device includes: a reflective electrode; a transparent electrode opposite the reflective electrode; an organic layer including a light-emitting layer between the reflective electrode and transparent electrode; and a low refractive index layer between the reflective electrode and light-emitting layer. The low refractive index layer has a function of transporting/injecting electrons/holes, and has a lower refractive index than the light-emitting layer. Distance between the surface of the reflective electrode and a central light-emitting position of the light-emitting layer is 300 nm or less. Furthermore, $\Delta n \times d / \lambda \leq -0.009$ and $\Delta n \times d / \lambda \leq -0.02$ are satisfied when the reflective electrode comprises Al and Ag, respectively, where: $\lambda$ denotes the central light-emitting wavelength of light generated in the light-emitting layer; $\Delta n$ denotes the refractive index difference between the low refractive index layer and the light-emitting layer, with the refractive index of the light-emitting layer as reference; and d denotes the thickness of the low refractive index layer.

11 Claims, 5 Drawing Sheets

(56) References Cited

U.S. PATENT DOCUMENTS

| | | |
|---|---|---|
| 7,608,856 B2 | 10/2009 | Becker et al. |
| 7,667,387 B2 | 2/2010 | Choi et al. |
| 7,957,621 B2 | 6/2011 | Zhang et al. |
| 8,249,409 B2 | 8/2012 | Zhang et al. |
| 2007/0221914 A1 | 9/2007 | Becker et al. |
| 2010/0150513 A1 | 6/2010 | Zhang et al. |
| 2011/0121272 A1 | 5/2011 | Lee et al. |
| 2011/0140151 A1 | 6/2011 | Lee et al. |
| 2011/0200293 A1 | 8/2011 | Zhang et al. |
| 2011/0204342 A1 | 8/2011 | Jeong et al. |
| 2012/0313129 A1 | 12/2012 | Zettsu et al. |
| 2013/0082244 A1* | 4/2013 | Heller et al. .................. 257/40 |

FOREIGN PATENT DOCUMENTS

| | | |
|---|---|---|
| JP | 2007-536718 | 12/2007 |
| JP | 2008-034701 | 2/2008 |
| JP | 2011-175952 | 9/2011 |
| JP | 2012-9336 | 1/2012 |
| JP | 2012-204019 | 10/2012 |
| JP | 2013-12377 | 1/2013 |
| TW | 201201622 | 1/2012 |
| WO | 2005/109539 | 11/2005 |
| WO | 2011/065358 | 6/2011 |
| WO | 2012/029750 | 3/2012 |
| WO | 2012/053398 | 4/2012 |
| WO | 2012/127746 | 9/2012 |
| WO | 2012/160714 | 11/2012 |
| WO | 2013/001891 | 1/2013 |
| WO | 2013/042745 | 3/2013 |

OTHER PUBLICATIONS

Chinese Office Action with Search Report mailed on Sep. 29, 2015 in corresponding Chinese Patent Application No. 201380000959.9 (with Translation of Search Report).

* cited by examiner

ORGANIC ELECTROLUMINESCENCE DEVICE AND METHOD OF FABRICATING THE SAME

CROSS REFERENCE TO RELATED APPLICATIONS

This is a continuation application of PCT International Application No. PCT/JP2013/000168 filed on Jan. 16, 2013, designating the United States of America, which is based on and claims priority of Japanese Patent Application No. 2012-009436 filed on Jan. 19, 2012. The entire disclosures of the above-identified applications, including the specifications, drawings and claims are incorporated herein by reference in their entirety.

FIELD

One or more exemplary embodiments disclosed herein relate to an organic electroluminescence device (hereafter referred to as "organic EL device") and a method of fabricating the organic EL device.

BACKGROUND

As light-emitting devices, application of organic EL devices to various apparatuses is being studied and put into practical use, and organic EL devices are being used, for example, as backlights for flat-panel displays and liquid crystal display apparatuses, or as light sources for lighting, and so on.

FIG. 6 is a cross-sectional view of a configuration of a typical organic EL device. As shown in FIG. 6, a typical organic EL device 100 is formed by stacking a reflective electrode 111, an organic layer 112, a transparent electrode 113, and a transparent substrate 114 in the stated order. The organic layer 112 is formed by stacking an electron injection layer, an electron transport layer, a light-emitting layer, a hole transport layer, a hole injection layer, and so on (not shown in the figure). It is typical to place the electron injection layer and the electron transport layer on the cathode-side, place the hole transport layer and the hole injection layer on the anode-side, and place the light-emitting layer in between the electron transport layer and the hole transport layer. Hereinafter, considering the case where the reflective electrode 111 is a cathode and the transparent electrode 113 is an anode, it is assumed that the electron transport layer and the hole transport layer are disposed to be in contact with the cathode and the anode, respectively. It should be noted that the same assumption can also be made in the case where the transparent electrode 113 is an anode and the reflective electrode 111 is a cathode.

In organic EL devices, there are many cases where the distance between a light-emitting position and the reflective electrode is set short (for example, 30 to 70 nm) in order to take advantage of the light interference effect to strengthen light in the frontal direction (upward direction in the figure). However, when the distance between the light-emitting position and the reflective electrode becomes short, the effects of surface plasmons are felt. Here, surface plasmons is an oscillation mode in which electrons in a surface of a metal oscillate collectively, and is a phenomenon that causes interaction between free electrons in the metal and light. In the organic EL device, metals such as aluminum (Al) and silver (Ag) are often used as the primary material for the reflective electrode, and, when the distance between the light-emitting position and the reflective electrode is short, part of the light generated at the light-emitting position is absorbed by the reflective electrode after bonding with surface plasmons. In such manner, in the organic EL device, there is the problem that light-emitting efficiency deteriorates due to the effects of surface plasmons.

In view of this, there is proposed a technique of improving light-emitting efficiency by exciting surface plasmons by providing, in the interface between the reflective electrode and the organic layer, protrusions having a regular pitch to thereby re-reflect light to the light-emitting layer side (Patent Literature (PTL) 1).

CITATION LIST

Patent Literature

[NPL 1]
U.S. Pat. No. 7,667,387 Specification

SUMMARY

Technical Problem

However, with the configuration disclosed in Patent Literature 1, there is the problem of the organic layer breaking due to stress which is generated when the protrusions are provided in the organic layer during the fabrication of the organic EL device. Furthermore, although porous mask alignment needs to be performed precisely in order to form the protrusions evenly in the substrate, there is the problem that porous mask alignment becomes extremely difficult when fabricating an organic EL device having a large surface area.

One non-limiting and exemplary embodiment provides an organic EL device in which the effects of surface plasmons are reduced and light-emitting efficiency is improved, and a fabricating method capable of realizing the organic EL device.

Solution to Problem

In one general aspect, the techniques disclosed herein feature an organic EL device including: a reflective electrode; a transparent electrode opposite the reflective electrode; a light-emitting layer between the reflective electrode and the transparent electrode; and a low refractive index layer between the reflective electrode and the light-emitting layer, wherein the low refractive index layer has a function of transporting or injecting electrons or holes, and has a refractive index lower than a refractive index of the light-emitting layer, a distance between a top surface of the reflective electrode and a central light-emitting position of the light-emitting layer is 300 nm or less, the reflective electrode comprises Al, and $\Delta n \times d/\lambda \leq -0.009$ is satisfied where: $\lambda$ denotes a central light-emitting wavelength of light generated in the light-emitting layer; $\Delta n$ denotes a difference between the refractive index of the low refractive index layer and the refractive index of the light-emitting layer when the refractive index of the light-emitting layer is used as reference; and d denotes a thickness of the low refractive index layer.

An organic EL device according to another aspect includes: a reflective electrode; a transparent electrode opposite the reflective electrode; a light-emitting layer between the reflective electrode and the transparent electrode; and a low refractive index layer between the reflective electrode and the light-emitting layer, wherein the low refractive index layer has a function of transporting or injecting electrons or holes, and has a refractive index lower than a refractive index of the light-emitting layer, a distance between a top surface of the reflective electrode and a central light-emitting position of the light-emitting layer is 300 nm or less, the reflective electrode comprises Ag, and $\Delta n \times d/\lambda \leq -0.02$ is satisfied where: $\lambda$ denotes a central light-emitting wavelength of light generated in the light-emitting layer; $\Delta n$ denotes a difference between the refractive index of the low refractive index layer and the refractive index of the light-emitting layer when the refractive index of the light-emitting layer is used as reference; and d denotes a thickness of the low refractive index layer.

A method of fabricating an organic electroluminescence (EL) device according to another aspect includes: forming a reflective electrode; forming a low refractive index layer above the reflective electrode, the low refractive index layer comprising nanoparticles; forming a light-emitting layer above the low refractive index layer; and forming a transparent electrode above the light-emitting layer, wherein the low refractive index layer has a function of transporting or injecting electrons or holes, and has a refractive index lower than a refractive index of the light-emitting layer.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to an organic EL device according to one or more exemplary embodiment or features disclosed herein, it is possible to suppress the effects of surface plasmons, and thus light-emitting efficiency can be improved.

Furthermore, according to an organic EL device according to one or more exemplary embodiment or features disclosed herein, it is possible to easily form a low-refraction index layer having a refraction index that is lower than a light-emitting layer.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
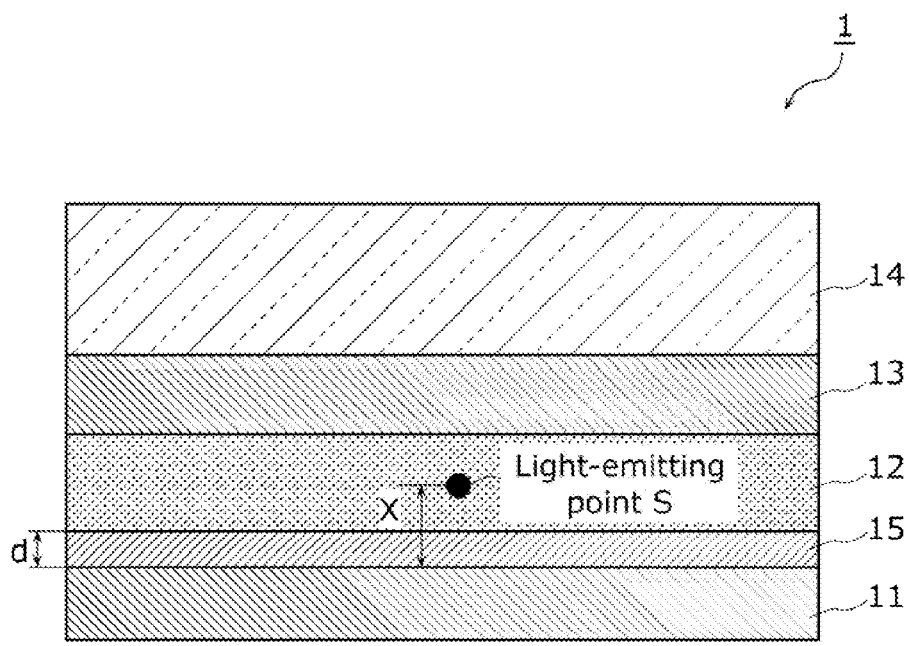
FIG. 1 is a schematic cross-sectional view of an organic EL device according to Embodiment 1.

An organic EL device according to one general aspect includes: a reflective electrode; a transparent electrode opposite the reflective electrode; a light-emitting layer between the reflective electrode and the transparent electrode; and a low refractive index layer between the reflective electrode and the light-emitting layer, wherein the low refractive index layer has a function of transporting or injecting electrons or holes, and has a refractive index lower than a refractive index of the light-emitting layer, a distance between a top surface of the reflective electrode and a central light-emitting position of the light-emitting layer is 300 nm or less, the reflective electrode comprises Al, and $\Delta n \times d/\lambda \leq -0.009$ is satisfied where: $\lambda$ denotes a central light-emitting wavelength of light generated in the light-emitting layer; $\Delta n$ denotes a difference between the refractive index of the low refractive index layer and the refractive index of the light-emitting layer when the refractive index of the light-emitting layer is used as reference; and d denotes a thickness of the low refractive index layer.

According to this aspect, the low refractive index layer is provided between the light-emitting layer and the reflective electrode, and thus the percentage of the light generated at the light-emitting layer which bonds with surface plasmons is reduced. Accordingly, since the effects of surface plasmons can be suppressed, light-emitting efficiency can be improved. Furthermore, since the distance between the top surface of the reflective electrode and the central light-emitting position of the light-emitting layer is 300 nm or less, light-emitting efficiency can be improved even when surface plasmons cause light-emitting efficiency to significantly deteriorate. In addition, in the case where the reflective electrode comprises Al, a light-emitting efficiency of 80% or higher can be realized by satisfying $\Delta n \times d/\lambda \leq -0.009$.

An organic EL device according to another aspect includes: a reflective electrode; a transparent electrode opposite the reflective electrode; a light-emitting layer between the reflective electrode and the transparent electrode; and a low refractive index layer between the reflective electrode and the light-emitting layer, wherein the low refractive index layer has a function of transporting or injecting electrons or holes, and has a refractive index lower than a refractive index of the light-emitting layer, a distance between a top surface of the reflective electrode and a central light-emitting position, of the light-emitting layer is 300 nm or less, the reflective electrode comprises Ag, and $\Delta n \times d/\lambda \leq -0.02$ is satisfied where: $\lambda$ denotes a central light-emitting wavelength of light generated in the light-emitting layer; $\Delta n$ denotes a difference between the refractive index of the low refractive index layer and the refractive index of the light-emitting layer when the refractive index of the light-emitting layer is used as reference; and d denotes a thickness of the low refractive index layer.

Likewise, according to this aspect, the low refractive index layer is provided between the light-emitting layer and the reflective electrode, and thus the percentage of the light generated at the light-emitting layer which bonds with surface plasmons is reduced. Accordingly, since the effect of surface plasmons can be suppressed, light-emitting efficiency can be improved. Furthermore, since the distance between the top surface of the reflective electrode and the central light-emitting position of the light-emitting layer is 300 nm or less, light-emitting efficiency can be improved even when surface plasmons cause light-emitting efficiency to significantly deteriorate. In addition, in the case where the reflective electrode comprises Ag, a light-emitting efficiency of 80% or higher can be realized by satisfying $\Delta n \times d/\lambda \leq -0.02$.

Furthermore, an organic EL device according to another aspect may further include an organic layer between the reflective electrode and the low refractive index layer, the organic layer having a function of transporting or injecting electrons or holes. Alternatively, the low refractive index layer may be in contact with the light-emitting layer.

Furthermore, an organic EL device according to another aspect may further include one of the following, in an interface at which a refractive index in the organic EL device changes: a diffraction grating; a light-diffusing layer; a microlens; and a pyramid structure.

According to this configuration, light extraction efficiency can be improved.

Furthermore, in an organic EL device according to another aspect, the low refractive index layer may comprise 0) a material having a function of transporting or injecting electrons or holes and (ii) nanoparticles which are mixed into the material. Alternatively, the low refractive index layer may include: a nanoparticle layer comprising nanoparticles; and a function layer above the nanoparticle layer, the function layer comprising a material having a function of transporting or injecting electrons or holes. Alternatively, the low refractive index layer may include: two function layers each having a function of transporting or injecting electrons or holes; and a nanoparticle layer between the two function layers, the nanoparticle layer comprising nanoparticles. In such cases, it is preferable that the nanoparticles have a grain size less than or equal to the thickness of the low refractive index layer. In addition, the nanoparticles may be porous particles. Moreover, it is preferable that the nanoparticles have a refractive index of 1.5 or less.

According to these configurations, a low refractive index layer having a lower refraction index than the light-emitting layer can be easily formed.

A method of fabricating an organic electroluminescence (EL) device according to another aspect includes: forming a reflective electrode; forming a low refractive index layer above the reflective electrode, the low refractive index layer comprising nanoparticles; forming a light-emitting layer above the low refractive index layer; and forming a transparent electrode above the light-emitting layer, wherein the low refractive index layer has a function of transporting or injecting electrons or holes, and has a refractive index lower than a refractive index of the light-emitting layer.

According to this configuration, a low refractive index layer having a lower refraction index than the light-emitting layer can be easily formed.

Furthermore, in a method of fabricating an organic EL device according to another aspect, in the forming of a low refractive index layer, the low refractive index layer may be formed by mixing the nanoparticles into a material having a function of transporting or injecting electrons or holes.

Furthermore, in a method of fabricating an organic EL device according to another aspect, the forming of a low refractive index layer may include: forming a nanoparticle layer comprising the nanoparticles; and forming a function layer comprising a material having a function of transporting or injecting electrons or holes.

Furthermore, in a method of fabricating an organic EL device according to another aspect, the forming of a low refractive index layer may include: forming a first function layer comprising a material having a function of transporting or injecting electrons or holes; forming a nanoparticle layer above the first function layer, the nanoparticle layer comprising the nanoparticles; and forming a second function layer above the nanoparticle layer, the second function layer comprising a material having a function of transporting or injecting electrons or holes.

Hereinafter, certain exemplary embodiments are described in detail with reference to the accompanying Drawings. Each of the exemplary embodiments described below shows a general or specific example. Therefore, the numerical values, shapes, materials, structural elements, the arrangement and connection of the structural elements, processes (steps), the processing order of the steps etc. shown in the following exemplary embodiments are mere examples, and therefore do not limit the scope of the appended Claims and their equivalents. Furthermore, among the structural elements in the following exemplary embodiments, structural elements not recited in any one of the independent claims are described as arbitrary structural elements.

Embodiment 1

First, an organic EL device 1 according to Embodiment 1 shall be described using FIG. 1. FIG. 1 is a schematic cross-sectional view of an organic EL device according to Embodiment 1.

As shown in FIG. 1, the organic EL device 1 according to this embodiment is formed by stacking a reflective electrode 11, a low refractive index layer 15, an organic layer 12, a transparent electrode 13, and a transparent substrate 14 in the stated order.

In the organic EL device 1 configured in the above manner, when a predetermined voltage is applied between the reflective electrode 11 and the transparent electrode 13, carriers (electrons or holes) are injected from the reflective electrode 11 into a light-emitting layer included in the organic layer 12 via the low refractive index layer 15. At this time, in order to perform the injection of carriers efficiently, either a carrier injection layer or a carrier transport layer or both may be inserted between the reflective electrode 11 and the low refractive index layer 15 or between the transparent electrode 13 and the organic layer 12. Furthermore, a carrier transport layer may be inserted between the low refractive index layer 15 and the light-emitting layer. It should be noted that, hereinafter, the carrier injection layer, the carrier transport layer, and the light-emitting ayer shall be called under the collective designation organic layer.

Although the respective structural elements of the organic EL device 1 and materials, and the like, which enable the realization of such structural elements shall be described in specific terms below, the organic EL device in this embodiment is not limited to such materials.

The reflective electrode 11 is a light-reflective electrode and has a function of returning light generated at the light-emitting layer within the organic layer 12, in a direction leading to an air layer (a region on the outer side of the transparent substrate 14). For the material of the reflective electrode 11, a metal such as Ag, Al, Cu, Mg, Li, and Na can be used. Furthermore, the reflective electrode 11 may be formed by stacking a transparent conductive material such as ITO (indium tin oxide) or PEDOT:PSS (a mixture of polythiophene and polystyrene sulfonate) above such metals so as to be in contact therewith. It should be noted that, in this embodiment, the reflective electrode 11 is a cathode. Furthermore, the reflective electrode 11 can be formed above a substrate, for example (not shown in the figure).

The organic layer 12 include light-emitting layer and is formed, for example, by stacking an electron injection layer, an electron transport layer, the light-emitting layer, a hole transport layer, a hole injection layer, and so on, or part of these function layers, in sequence from the reflective electrode 11-side toward the transparent electrode 13. In this embodiment, the transparent electrode 13 is an anode, and thus the hole transport layer and the hole injection layer are disposed on the transparent electrode 13-side.

For the material of the hole injection layer, ITO, IZO (indium zinc oxide), PEDOT:PSS, and so on, can be used, for example.

For the material of the hole transport layer, it is possible to use a hole-transportive material such as a triarylamine compound represented by 4,4'-bis[N-(naphtyl)-N-phenyl-amino]biphenyl (alpha-NPD), N,N'-bis(3-methylphenyl)-(1,1'-bihphenyl)-4,4'-diamine (TPD), 2-TNATA, 4,4',4"-tris(N-(3-methylphenyl)N-phenylamino) triphenylamine (MTDATA), 4,4'-N,N"-dicarbazoebiphenyl (CBP), spiro-NPD, Spiro-TPD, spiro-TAD, TNB, and so on, or an amine compound including a carbazole group, an amine compound including a fluorine derivative, or the like The light-emitting layer is an organic light-emitting layer provided between the reflective electrode 11 and the transparent electrode 13. As to the material of the light-emitting layer, for example, in the case of a red light-emitting layer capable of emitting a red light, it is possible to use a layer in which Alq 3 is doped with [2-[2-[4-(dimethylamino) phenyl]ethynyl]-6-methyl-4H-ylidene]-propane propanedinitrile (DCM dye); in the case where of a green light-emitting layer capable of emitting green light, it is possible to use a layer comprising Alq 3; and in the case of a blue light-emitting layer capable of emitting blue light, it is possible to use a layer in which bis(2-methyl-8-kinoritorato, para-phenylphenolato) aluminum (BAlq3) is doped with penylene. Furthermore, a white light source can also be provided by stacking two or more layers having different primary light-emitting wavelengths, represented by the above layers. The refractive index of the light-emitting layer is approximately 1.7 to 1.9.

For the material of the electron transport layer, it is possible to use metal complexes which are known as electron-transportive materials such as Alq3, or heterocyclic compounds such as phenanthroline derivatives, pyridine derivatives, tetrazine derivatives, oxadiazole derivatives, and so on.

For the material of the electron injection layer, a metal-doped organic material can be used. In this case, for example, Li, Cs, Na, and so on, are given as a doping material. Furthermore, a thin film of Li or Mg which are low work function materials, a compound thereof, and so on, may be stacked to be in contact with the reflective electrode 11.

The transparent electrode 13 is a light-transmissive electrode, and is provided opposite the reflective electrode 11. When a voltage is applied between the reflective electrode 11 and the transparent electrode 13, carriers (electrons or holes) are injected from transparent electrode 13 into the organic layer 12. For the material of the transparent electrode 13, a transparent conductive material such as ITO, IZO, PEDOT:PSS, or the like, can be used. Furthermore, the material of the transparent electrode 13 need not be transparent, and the transparent electrode 13 can also be formed using a thin-film conductor obtained by forming a conductor such as Ag (silver) or Al (aluminum) into a thin film of 100 nm or less to allow transmission of light. It should be noted that, in this embodiment, the transparent electrode 13 is an anode.

The transparent substrate 14 is provided above the transparent electrode 13, and is a light-transmissive substrate. The transparent substrate 14 is provided to protect the top surface of the transparent electrode 13. For the material of the transparent substrate 14, for example, a glass substrate comprising glass, a plastic barrier film comprising a transparent resin, and so on, can be used.

The low refractive index layer 15 is provided between the reflective electrode 11 and the light-emitting layer. In this embodiment, the low refractive index layer 15 is provided between the reflective electrode 11 and the organic layer 12, as shown in FIG. 1. The low refractive index layer 15 is a low refractive index functional layer which has a function of transporting or injecting electrons or holes, and is configured to have a refractive index that is lower than the refractive index of the light-emitting layer. Furthermore, the low refractive index layer 15 functions as a phase controlling layer which changes the phase of passing light according to its refractive index, and is capable of causing a phase difference between light that is directly headed toward the transparent electrode 13-side and light that is headed toward the transparent electrode 13 after being reflected by the reflective electrode 11. This phase difference can be controlled by adjusting the refractive index of the low refractive index layer 15.

For the material of the low refractive index layer 15, an arbitrary material having a function of transporting or injecting electrons or holes and having a refractive index that is lower than the refractive index of the light-emitting layer can be used.

As a material having a function of transporting electrons, it is possible to suitably select from a group of electron-transportive compounds. As compounds of such type, there are for example, metal complexes which are known as electron-transportive materials such as Alq3, or heterocyclic compounds such as phenanthroline derivatives, pyridine derivatives, tetrazine derivatives, oxadiazole derivatives, and so on. However, the material of the low refractive index layer 15 is not limited to such materials, and a commonly known arbitrary electron-transportive material can be used, and in particular, it is preferable that a material having high electron transporting property be used.

Furthermore, as a material having a function of transporting holes, it is possible to suitably select from a group of compounds having hole transporting properties. As a compound of this type, for example, there is a triarylamine compound represented by 4,4'-bis[N-(naphtyl)-N-phenyl-amino]biphenyl (alpha-NPD), N,N'-bis(3-methylphenyl)-(1,1'-bihphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, TND, and so on, or an amine compound including a carbazole group, an amine compound including a fluorine derivative, and so on. However, the material having a function of transporting holes is not limited to such materials, and a commonly known arbitrary hole-transportive material can be used.

In addition, a low refractive index material such as nanoparticles may be mixed into the aforementioned material having the function of transporting or injecting electrons or holes. For example, the low refractive index layer 15 can be a nanoparticle mixed layer comprising a material having the function of transporting or injecting electrons or holes, and nanoparticles which are mixed into the material.

This is because, although there are few materials having a lower refractive index than the light-emitting layer and it is difficult to freely control the refractive index of the low refractive index layer 15, the low refractive index layer 15 having the desired low refractive index can be easily obtained by forming a film by using a low refractive index material such as nanoparticles as the low refractive index material and mixing the low refractive index material such as nanoparticles into the aforementioned material having the function of transporting or injecting electrons or holes. Furthermore, by mixing in the nanoparticles, the refractive index can be lowered. Furthermore, by adjusting the mixed quantity of the nanoparticles in the layer, the refractive index of the low refractive index layer 15 can be easily controlled.

In other words, even with a material having a higher refractive index than the light-emitting layer, the low refractive index layer 15 having a lower refractive index than the light-emitting layer can be obtained by mixing nanoparticles into such material. Alternatively, nanoparticles may be mixed into a material having a lower refractive index than the light-emitting layer, and by mixing nanoparticles into the material having a lower refractive index than the light-emitting layer, the low refractive index layer 15 having a refractive index that is even lower than such material can be obtained.

Although such a nanoparticle-inclusive low refractive index 15 may be formed by a dry process such as vapor deposition, transfer, or the like, or by an application process such as spin-coating, spray-coating, dye-coating, gravure printing, or the like, the application process in which the film can be formed by mixing the nanoparticles into the above material before hand allows for easier film forming.

In addition, in this case, it is preferable that the grain size of the nanoparticles be less than the thickness of the low refractive index film 15. For example, when nanoparticles having a grain size of 100 nm or less are used, the grain size of the nanoparticles are sufficiently smaller than the light-emitting wavelength (for example, a light-emitting wavelength in the visible light region), and thus the refractive index of the low refractive index 15 can be effectively reduced. With this, it becomes possible to easily obtain the low refractive index layer 15 having the desired low refractive index.

Furthermore, it is preferable that the refractive index of the nanoparticles be 1.5 or lower. As described above, by setting the refractive index of the nanoparticles to be 1.5 or lower, it becomes possible to easily obtain the low refractive index layer 15 having a lower refractive index than the light-emitting layer. For example, in the case where the refractive index of the light-emitting layer is approximately 1.75, even when using only the aforementioned material does not allow the refractive index of the low refractive index layer 15 to be lower than the refractive index of the light-emitting layer, a low refractive index layer 15 having a refractive index lower than 1.75 can be easily obtained by mixing in nanoparticles having a refractive index of 1.5 or lower.

Furthermore, for the nanoparticles, it is possible to use, for example, porous particles that allow lowering of refractive index. In this case, the refractive index of the porous particles can be obtained through Expression (1) below, using the porosity [%] of the porous particles.

(Refractive index of porous particle material)×(1−porosity/100)+porosity/100 (1)

According to Expression (1), the refractive index of the porous particles can be lowered as the porosity is increased, and thus it is preferable that the porosity of the nanoparticles be high.

Furthermore, although a metal oxide can be given as a porous particle material for example, a material having a low refractive index may be used as the porous particle material according to Expression (1). Porous silica is particularly desirable as such a porous particle material. Furthermore, as porous silicas, there are hollow silica, nanoporous silica, mesoporous silica, and so on. The refractive index of silica ($SiO_2$) is approximately 1.5, and a porosity of porous silica of approximately 40% can be realized. In this case, according to Expression (1), the refractive index of such porous silica becomes 1.3.

In this manner, by using the above described material as the materials of the respective structural elements of the organic EL device 1, an organic EL device having high light-emitting efficiency can be realized. It should be noted that although the reflective electrode 11 is assumed to be a cathode in this embodiment, in the case where the reflective electrode 11 is assumed to be an anode, the electron injection layer and the electron transport layer is disposed on the transparent electrode 13-side, and the hole injection layer and the hole transport layer is disposed on the reflective electrode 11-side. Even in this case, adopting the above-described material configuration allows an organic EL device having high light-emitting efficiency to be realized.

Figure 6:
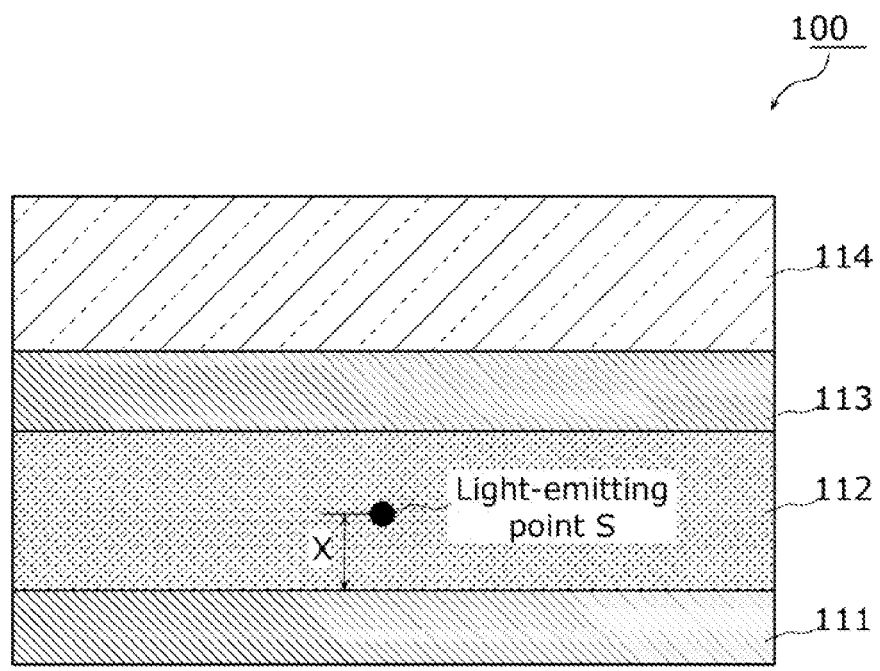
FIG. 6 is a cross-sectional view of a configuration of a typical organic EL device.

Next, the advantageous effects of the organic EL device 1 according to this embodiment shown in FIG. 1 shall be described in comparison with the organic EL device 100 having the configuration shown in FIG. 6.

In the organic EL device 1 (100) shown in FIG. 1 and FIG. 6, when a predetermined voltage is applied between the reflective electrode 11 (111) and the transparent electrode 13 (113), electrons and holes are injected into the organic layer 12 (112) from the reflective electrode 11 (111) and the transparent electrode 13 (113), respectively. Light is generated through the bonding of these holes and electrons in the light-emitting layer inside the organic layer 12 (112). The light generated in the light-emitting layer passes through the transparent electrode 13 (113) and the transparent substrate 14 (114) to be extracted to the air layer outside the organic EL device 1 (100).

In this case, the light is generated at a light-emitting position (light-emitting point) S in the light-emitting layer of the organic layer 12 (112), as shown in FIG. 1 and FIG. 6. The light-emitting position S is determined according to the configuration of the organic layer 12 (112). Although the organic EL device is often referred to as a surface light source, it is appropriate to think in terms of a model in which a large number of light-emitting positions S which do not interfere with each other are distributed planarly, because, in actuality, a large number of molecules involved in light emission are present in a planar form on the light-emitting surface. Therefore, the subsequent description considers the light from a single light-emitting point S.

As described above, when the configuration of the organic layer 12 (112) is determined, the light-emitting point S is determined. The light-emitting point S extends finitely in the thickness direction of the light-emitting layer. Therefore, the subsequent description uses, as the light-emitting position S, a central light emitting position S obtained by assigning light-emitting intensity-based weights to respective positions and taking the average. It should be noted that the position of the central light-emitting position S can also be detected by observing the layer configuration through cross-section observation. Furthermore, the position of the central light-emitting position S can also be detected using the method described in Nature Photonics, vol. 4, p. 329 (2010), and so on.

Furthermore, the light-emitting wavelength λ of the light generated at the central light-emitting position S is determined by the material of the organic layer 12 (112). The subsequent description uses a central light-emitting wavelength λ obtained by assigning weights to the respective wavelengths based on their intensity and taking the average.

Next, the effects of surface plasmons on the organic EL devices having the configurations shown in FIG. 1 and FIG. 6 shall be described.

Figure 7:
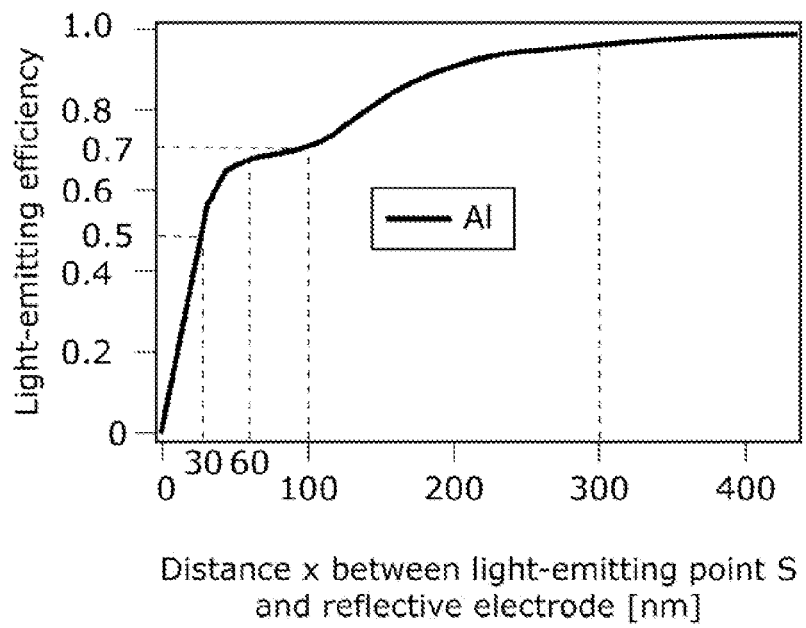
FIG. 7 is a graph showing the relationship between light-emitting efficiency and a distance (x) between a light-emitting point S and a reflective electrode (Al).

First, in order to describe the effects of surface plasmons on the organic EL 100 in FIG. 6, the case where aluminum (Al) is used as the material of the reflective electrode 111 in the organic EL device 100 in FIG. 6 shall be described using FIG. 7. FIG. 7 is a graph showing the results of calculating the dependency of light-emitting efficiency on a distance x between a light-emitting point (central light-emitting position) S and an Al reflective electrode.

As shown in FIG. 7, it can be seen that the light-emitting efficiency is lower as the distance x between the light-emitting point (central light-emitting position) S and the top surface of the reflective electrode 111 is shorter. This is because, of the light generated when the carriers bond together, light heading toward the reflective electrode 111 bonds with surface plasmons and the percentage of propagated light heading toward the transparent substrate 114-side is reduced as the distance x between the light-emitting point S and the top surface of the reflective electrode 111 is shorter. In this manner, in the organic EL device 100 having the configurations shown in FIG. 6, light-emitting efficiency deteriorates due to the surface plasmons, and in particular, light-emitting efficiency starts to deteriorate when the distance x is 300 nm or less. In other words, the effects of surface plasmons become noticeable when the distance x is 300 nm or less.

In view of this, in the organic EL device 1 shown in FIG. 1, the low refractive index layer 15 having a lower refractive index than the light-emitting layer is provided between the light-emitting point (central light-emitting position) S and the reflective electrode 11, that is, between the light-emitting layer and the reflective electrode 11, in order to reduce such a loss due to surface plasmons. By providing the low refractive index layer 15 in the manner described above, the electrical field spreading throughout the metal surface due to the light interference effect can be reduced, and thus the bonding of the light generated at the light-emitting layer with the surface plasmons can be suppressed. With this, the light-emitting efficiency of the organic EL device can be improved.

Figure 2:
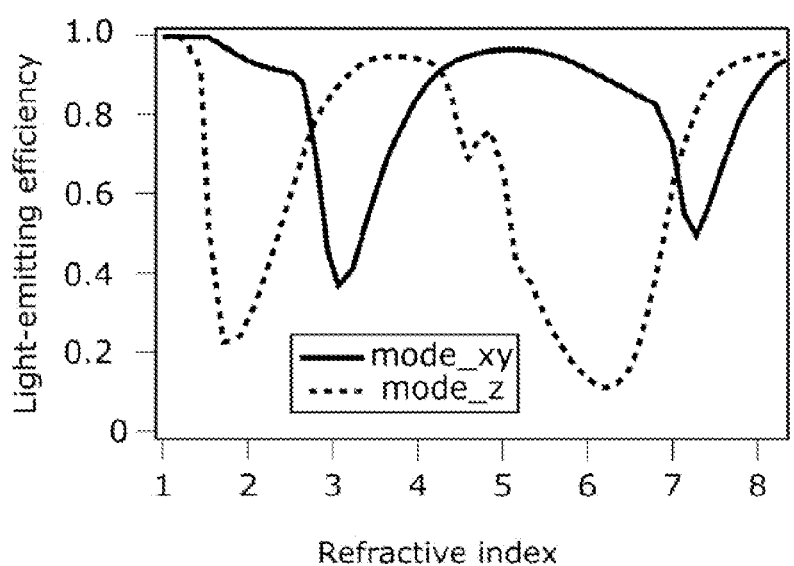
FIG. 2 is a graph showing the relationship between light-emitting efficiency and the refractive index of a low refractive index layer according the organic EL device in Embodiment 1.

Here, the relationship between the refractive index of the low refractive index layer 15 and the light-emitting efficiency of the organic EL device shall be described using FIG. 2. FIG. 2 is a graph showing the relationship between light-emitting efficiency and the refractive index of the low refractive index layer in Embodiment 1, and shows the result of calculating the dependency of light-emitting efficiency on the refractive index of the low refractive index layer in the configuration shown in FIG. 1. It should be noted that FIG. 2 shows the result of the calculation when, in the configuration in FIG. 1, the light-emitting wavelength is 520 nm, the refractive index of the light-emitting layer is 1.75, the reflective electrode 11 comprises aluminum (refractive index 1+6i), the position of the light-emitting point (central light-emitting position) S satisfies x=60 nm, and the thickness (d) of the low refractive index layer 15 is 50 nm. Furthermore, in order to verify dependency over a wide range of refractive indices, calculation is performed with the refractive index being changed from 1 to 8. In addition, since the bonding to surface plasmons is different depending on the orientation of light-emitting molecules, calculation is performed for each of light-emitting molecules in a horizontal direction (xy direction) (solid line in the figure) and light-emitting molecules in the vertical direction (z direction) (broken line in the figure), with respect to the top surface of the low refractive index layer.

As can be seen from FIG. 2, an interference effect is exhibited in which light-emitting efficiency is dependent on the refractive index of the low refractive index layer, a light-emitting efficiency that is high at intervals within a predetermined range of refractive indices can be obtained, and the state of the suppression of surface plasmons fluctuates. For example, when the refractive index of the low refractive index layer is 2 or less, it can be seen that, in the case where the bonding of both the horizontal direction light-emitting molecules and the vertical direction light-emitting molecules with surface plasmons can be suppressed, the refractive index of the low refractive index layer is in a region that is lower than the refractive index (1.75) of the light-emitting layer.

In this manner, the inventors have found that light-emitting efficiency is dependent on the refractive index of the low refractive index layer, and were able to conceive the idea that the effects of surface plasmons can be suppressed and thereby improve light-emitting efficiency by providing, between the reflective electrode and the light-emitting layer, the low refractive index layer having a lower refractive index than the light-emitting layer.

It should be noted that, according to FIG. 2, there is a region in which high light-emitting efficiency can be obtained even when the refractive index of the low refractive index layer is greater than 2. However, with typical organic EL device materials, obtaining a high refractive index is difficult. On the other hand, molecules having a low refractive index can be realized by executing a molecule design that increases bonds having low polarizability, increases molecule volume, and so on. For example, the refractive index can be lowered by introducing a refractive index-lowering material such as fluorine into the molecule. In this manner, the low refractive index layer can also be formed by using a material incorporating a molecule design such as that described above for the material of the already-existing carrier injection layer or the carrier transport layer.

Figure 3A:
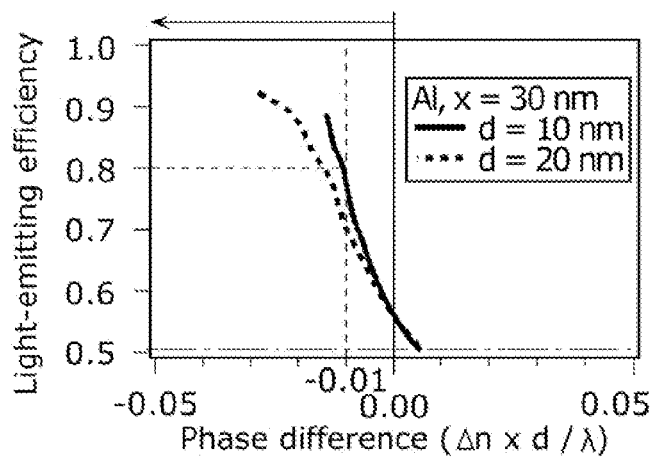
FIG. 3A is a graph showing the relationship between light-emission efficiency and the phase difference caused by the low refractive index layer in the organic EL device according to Embodiment 1 (x=30 nm).
Figure 3B:
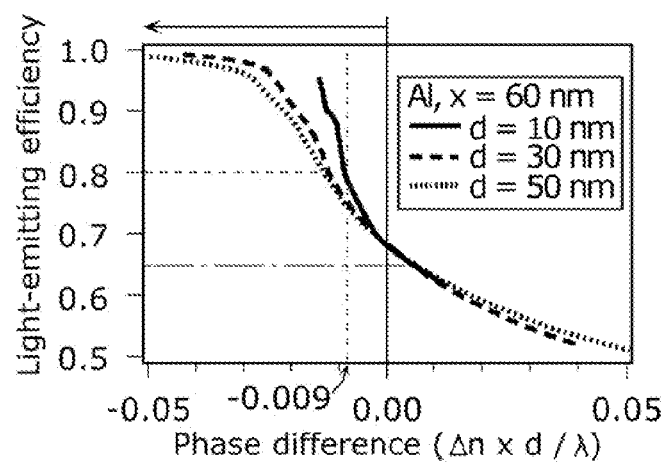
FIG. 3B is a graph showing the relationship between light-emission efficiency and the phase difference caused by the low refractive index layer in the organic EL device according to Embodiment 1 (x=60 nm).
Figure 3C:
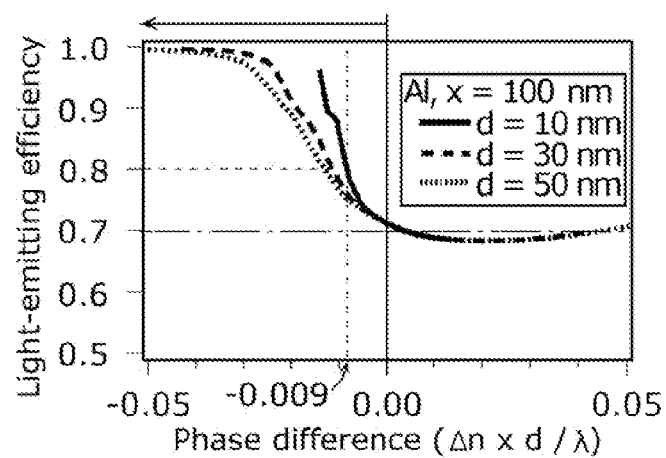
FIG. 3C is a graph showing the relationship between light-emission efficiency and the phase difference caused by the low refractive index layer in the organic EL device according to Embodiment 1 (x=100 nm).

Next, the results of a detailed study on the relationship between the low refractive index layer 15 and light-emitting efficiency when the light-emitting point S, the thickness d of the low refractive index layer, and the phase difference caused following the introduction of the low refractive index layer are changed shall be described using FIG. 3A to FIG. 3C. FIG. 3A to FIG. 3C are graphs showing the relationship between light-emission efficiency and the phase difference caused by the low refractive index layer in the organic EL device according to Embodiment 1. FIG. 3A shows the calculation results for the case where the light-emitting point S satisfies x=30 nm, FIG. 3B shows the calculation results for the case where the light-emitting point S satisfies x=60 nm, and FIG. 3C shows the calculation results for the case where the light-emitting point S satisfies x=100 nm.

It should be noted that, in each of these figures, the horizontal axis denotes the phase difference, the vertical axis denotes the light-emitting efficiency, and calculation is performed under the assumption that, in the configuration in FIG. 1, the light-emitting wavelength is 520 nm, the refractive index of the light-emitting layer is 1.75, the reflective electrode 11 comprises aluminum (refractive index 1+6i), while the thickness d of the low refractive index layer is changed within a range of 10 nm<d<50 nm, and the refractive index difference $\Delta n$ is changed within a range of $-0.75<\Delta n<0.75$. Furthermore, it is assumed that the phase difference satisfies $\Delta n \times d/\lambda$, and $\Delta n$ denotes the difference between the refractive indices of the low refractive index layer and the light-emitting layer when the refractive index of the light-emitting layer is taken as reference (refractive index difference: low refractive index layer refractive index–light-emitting layer refractive index).

As shown in FIG. 3A to FIG. 3C, light-emitting efficiency rises when the refractive index of the low refractive index layer is lower than the refractive index of the light-emitting layer (i.e., when $\Delta n$ is a negative value).

For example, in the case where the light-emitting point S satisfies x=30 nm, the light-emitting efficiency when the low refractive index layer is not provided is approximately 0.5 as shown in FIG. 7. However, as shown in FIG. 3A, by making the refractive index difference $\Delta n$ negative, that is, by making the refractive index of the low refractive index layer lower than the refractive index of the light-emitting layer, the light-emitting efficiency when the low refractive index layer is provided improves beyond 0.5.

Furthermore, in the case where the light-emitting point S satisfies x=60 nm, the light-emitting efficiency when the low refractive index layer is not provided is approximately 0.65 as shown in FIG. 7. However, as shown in FIG. 3B, by making the refractive index difference $\Delta n$ negative, the light-emitting efficiency when the low refractive index layer is provided improves beyond 0.65.

Furthermore, in the case where the light-emitting point S satisfies x=100 nm, the light-emitting efficiency when the low refractive index layer is not provided is approximately 0.7 as shown in FIG. 7. However, as shown in FIG. 3C, by making the refractive index difference $\Delta n$ negative, the light-emitting efficiency when the low refractive index layer is provided improves beyond 0.7.

In this manner, by setting the phase difference ($\Delta n \times d/\lambda$) of the low reference index layer 15 at most 0, light-emitting efficiency can be improved.

Furthermore, it is preferable that the light-emitting efficiency be 80% or higher. This is because, when the organic EL device is taken into consideration as a product, it is possible to survive market competition if the light-emitting efficiency can surpass that of existing devices, and the measure for light-emitting efficiency in this case is 80%. For example, in the case of lighting apparatuses, an organic EL light needs to surpass the efficiency of a fluorescent light. With fluorescent lights, a device power efficiency of approximately 40% is realized. With the organic EL device, there is at least a loss of approximately 50% due to losses attributed to internal quantum efficiency and total reflection, and thus, in order to exceed 40% in terms of power efficiency, it is desirable that the light-emitting efficiency determined by plasmon-based loss be 80% or higher.

Based on FIG. 3A to FIG. 3C, the condition for setting the light-emitting efficiency to 80% or higher in all the cases shown in the figures is that the phase difference be at most minus 0.009. Therefore, it is preferable that the phase difference ($\Delta n \times d/\lambda$) of the low reference index layer 15 be set to at most −0.009.

Next, method of fabricating the organic EL device 1 according to this embodiment shall be described with reference to FIG. 1. First, the reflective electrode 11 comprising Al is formed above a substrate (not shown in the figure) (reflective electrode forming process), Next, the low refractive index layer 15 including a refractive index-lowering material such as nanoparticles is formed above the reflective electrode 11 (low refractive index layer forming process). In this process, the low refractive index layer 15 is formed by mixing nanoparticles into a material having a function of transporting or injecting electrons or holes. Next, the organic layer 12 comprising plural layers including a light-emitting layer is formed above the low refractive index layer 15 (organic layer forming process). Next, the transparent electrode 13 is formed above the organic layer 12 (transparent electrode forming process). Subsequently, the transparent substrate 14 is provided above the transparent electrode 13. With this, the organic EL device 1 can be fabricated. It should be noted that, for the material of each structural element in the organic EL device 1, the previously described materials can be used as appropriate.

(Modification 1 of Embodiment 1)

Next, an organic EL device according to Modification 1 of Embodiment 1 shall be described. Since the organic EL device according to this modification has the same basic configuration as the organic EL device 1 shown in FIG. 1, the differences between the two devices shall be described below.

The organic EL device according to this modification and the organic EL device 1 according to Embodiment 1 described above are different in terms of the configuration of the low refractive index layer. Specifically, whereas the low refractive index layer 15 in Embodiment 1 described above is formed by mixing a refractive index-lowering material such as nanoparticles into a material having a function of transporting or injecting electrons or holes, the low refractive index layer in this modification is configured of a stacked film of a low refractive index material layer (nanoparticle layer) comprising a low refractive index material such as nanoparticles, and a function layer stacked above the low refractive index material layer (nanoparticle layer) and comprising a material having a function of transporting or injecting electrons or holes. In this manner, in this modification, the low refractive index layer 15 having a lower refractive index than the light-emitting layer is configured by stacking a low refractive index material layer such as the nanoparticle layer and the function layer which is a carrier transport layer or a carrier injection layer comprising a common material.

Furthermore, a method of fabricating the organic EL device according to this modification and the method of fabricating the organic EL device 1 according to Embodiment 1 described above are different in terms of the low refractive index layer forming process. Specifically, the low refractive index layer forming process in this modification includes a process of forming a low refractive index material layer (nanoparticle layer) comprising a low refractive index material such as nanoparticles, and a process of forming, above the low refractive index material layer, a function layer comprising a material having a function of transporting or injecting electrons or holes. In other words, the low refractive index material layer, which comprises a low refractive index material, and the function layer, which is a carrier transport layer or a carrier injection layer comprising a common material, are formed separately.

The organic EL device according to this modification configured in the manner described above is capable of producing the same advantageous effect as the organic EL device according to Embodiment 1, and is thus capable of suppressing the effects of surface plasmons and thereby improving light-emitting efficiency.

Furthermore, although forming the low refractive index layer using the method in this modification reduces the degree of freedom of the refractive index of the low refractive index layer, the occurrence of short circuits and dark spots of which nanoparticles are a factor can be reduced compared to the method in Embodiment 1. Furthermore, in this modification, the film-forming process for a common function layer (electron-transportive material, hole-transportive material, or the like) can be used, and a dry process such as vapor deposition, transfer, or the like, or an application process such as spin-coating, spray-coating, dye-coating, gravure printing, or the like, can be easily applied.

(Modification 2 of Embodiment 1)

Next, an organic EL device according to Modification 2 of Embodiment 1 shall be described. Since the organic EL device in this modification has the same basic configuration as the organic EL device 1 shown in FIG. 1, the differences between the two devices shall be described below.

The organic EL device according to this modification and the organic EL device according to Embodiment 1 described above are different in terms of the configuration of the low refractive index layer. Specifically, the low refractive index layer in this modification is configured of a stacked film of a first function layer comprising a material having a function of transporting or injecting electrons or holes, a low refractive index material layer such as a nanoparticle layer stacked above the first function layer, and a second function layer stacked above the low refractive index material layer and comprising a material having a function of transporting or injecting electrons or holes. In other words, the low refractive index layer 15 having a lower refractive index than the light-emitting layer is configured by stacking layers so that a low refractive index material layer (nanoparticle layer, or the like) comprising a low refractive index material such as nanoparticles is interposed between two function layers each of which is a carrier transport layer or a carrier injection layer comprising a common material.

Furthermore, a method of fabricating the organic EL device according to this modification and the method of fabricating the organic EL device 1 according to Embodiment 1 described above are different in terms of the low refractive index layer forming process. Specifically, the low refractive index layer forming process in this modification includes a process of forming a first function layer comprising a material having a function of transporting or injecting electrons or holes, a process of forming, above the first function layer, a low refractive index material layer such as a nanoparticle layer, and a process of forming, above the nanoparticle layer, a second function layer comprising a material having a function of transporting or injecting electrons or holes. In other words, the nanoparticle layer comprising a low refractive index material and the function layers, each of which is carrier transport layer or a carrier injection layer comprising a common material, are formed separately.

The organic EL device according to this modification configured in the manner described above is capable of producing the same advantageous effect as the organic EL device according to Embodiment 1, and is thus capable of suppressing the effects of surface plasmons and thereby improving light-emitting efficiency.

Furthermore, as with Modification 1, with this modification, the degree of freedom of the refractive index of the low refractive index layer is reduced but, compared to the method in Embodiment 1, the occurrence of short circuits and dark spots of which nanoparticles are a factor can be suppressed. Furthermore, as in Modification 1, in this modification, the film-forming process for a common function layer (electron-transportive material, hole-transportive material, or the like) can be used, and a dry process such as vapor deposition, transfer, or the like, or an application process such as spin-coating, spray-coating, dye-coating, gravure printing, or the like, can be easily applied.

Embodiment 2

Next, an organic EL device according to Embodiment 2 shall be described. Since the organic EL device in this embodiment has the same basic configuration as the organic EL device 1 shown in FIG. 1, the differences between the two devices shall be described below. Furthermore, since the configuration of the organic EL device in this embodiment is the same as that in Embodiment 1, description in this embodiment shall also be carried with reference to FIG. 1.

The organic EL device according to Embodiment 2 and the organic EL device according to Embodiment 1 are different in terms of the material of the reflective electrode 11. Specifically, whereas the material of the reflective electrode 11 in Embodiment 1 described above comprises aluminum (Al), the reflective electrode 11 in Embodiment 2 comprises silver (Ag). It should be noted that configurations other than the material of the reflective electrode 11 are the same as in Embodiment 1. Furthermore, the organic EL device according to this embodiment can be fabricated using the same method as in Embodiment 1.

Figure 8:
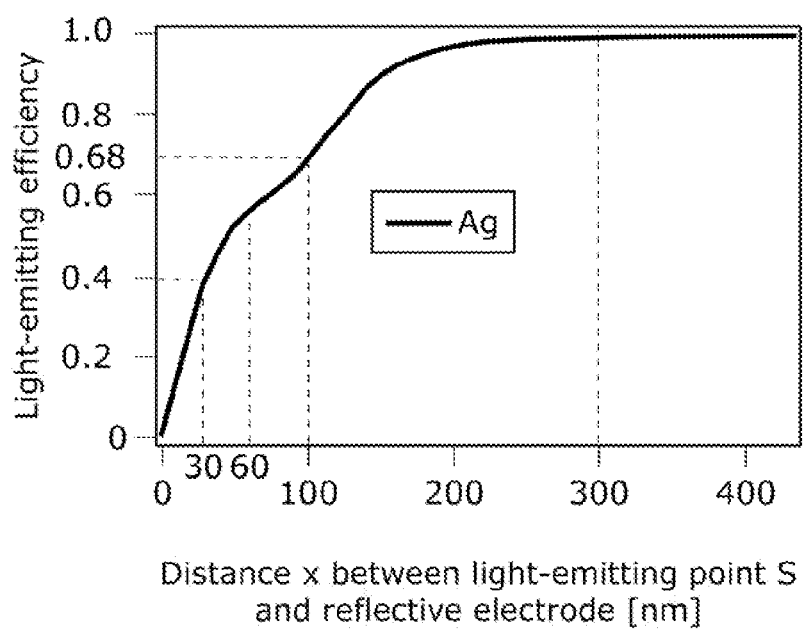
FIG. 8 is a graph showing the relationship between light-emitting efficiency and a distance (x) between a light-emitting point S and a reflective electrode (Ag).

The effects of surface plasmons on the organic EL device according to this embodiment shall be described below. First, as in Embodiment 1, the case where Ag is used as the material of the reflective electrode 111 in the organic EL device 100 shown in FIG. 6 shall be described using FIG. 8. FIG. 8 is a graph showing the results of calculating the dependency of light-emitting efficiency on a distance x between a light-emitting point (central light-emitting position) S and an Ag reflective electrode.

As shown in FIG. 8, it can be seen that the light-emitting efficiency is lower as the distance x between the central light-emitting position S and the top surface of the reflective electrode 111 is shorter. This is because, of the light generated when the carriers bond together, light heading toward the reflective electrode 111 bonds with surface plasmons and the percentage of propagated light heading toward the transparent substrate 114-side is reduced as the distance x between the central light-emitting position S and the top surface of the reflective electrode 111 is shorter. In this manner, even in the organic EL device 100 in which the reflective electrode 111 comprises Ag, light-emitting efficiency deteriorates due to the surface plasmons, and in particular, light-emitting efficiency starts to deteriorate when the distance x is 300 nm or less. In other words, even in the case where the reflective electrode 111 comprises Ag, the effects of surface plasmons become noticeable when the distance x is 300 nm or less.

Thus, in this embodiment, the low refractive index layer 15 is also provided between the light-emitting layer and the reflective electrode in the same manner as in Embodiment 1, in order to reduce loss caused by surface plasmons. With this, the light-emitting efficiency of the organic EL device can be improved.

Figure 4A:
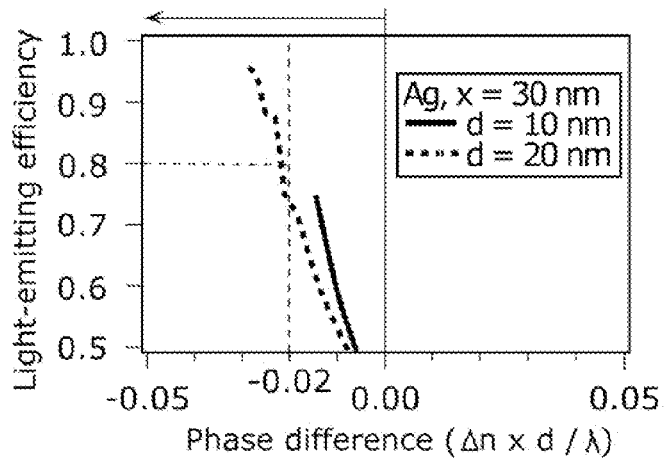
FIG. 4A is a graph showing the relationship between light-emitting efficiency and the phase difference caused by the low refractive index layer according the organic EL device in Embodiment 1 (x=30 nm).
Figure 4B:
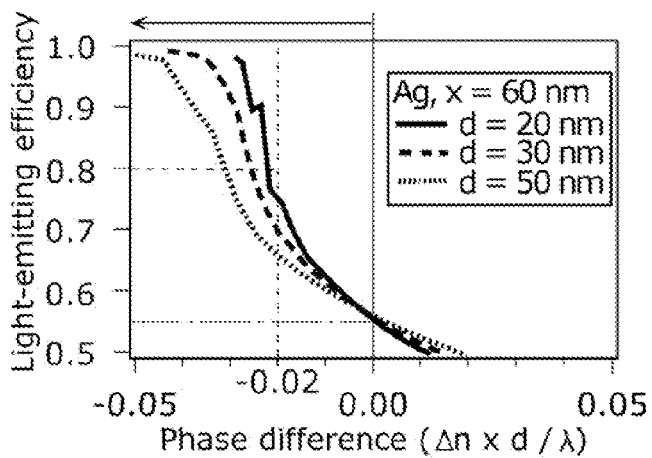
FIG. 4B is a graph showing the relationship between light-emitting efficiency and the phase difference caused by the low refractive index layer according the organic EL device in Embodiment 1 (x=60 nm).
Figure 4C:
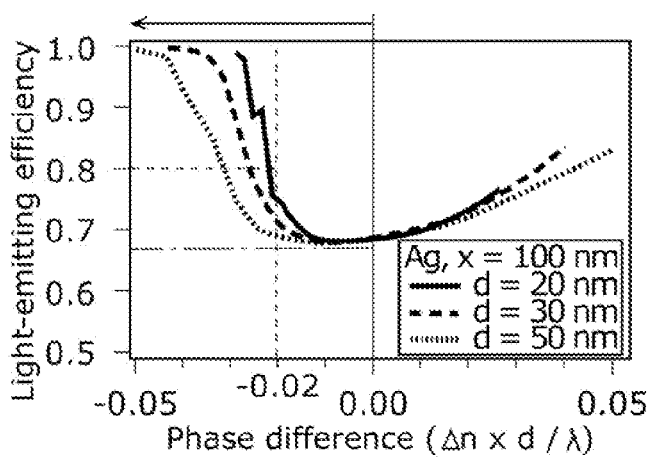
FIG. 4C is a graph showing the relationship between light-emission efficiency and the phase difference caused by the low refractive index layer in the organic EL device according to Embodiment 1 (x=100 nm).

Here, the results of a detailed study on the relationship between the low refractive index layer 15 and light-emitting efficiency when the light-emitting point S, the thickness d of the low refractive index layer, and the phase difference are changed shall be described using FIG. 4A to FIG. 4C FIG. 4A to FIG. 4C are graphs showing the relationship between light-emission efficiency and the phase difference caused by the low refractive index layer in the organic EL device according to Embodiment 2, FIG. 4A shows the calculation results for the case where the light-emitting point S satisfies x=30 nm, FIG. 4B shows the calculation results for the case where the light-emitting point S satisfies x=60 nm, and FIG. 4C shows the calculation results for the case were the light-emitting point S satisfies x=100 nm.

It should be noted that, in each of these figures, the horizontal axis denotes the phase difference, the vertical axis denotes the light-emitting efficiency, and calculation is performed under the assumption that, in the configuration in FIG. 1, the light-emitting wavelength is 520 nm, the refractive index of the light-emitting layer is 1.75, the reflective electrode 11 comprises silver, and the thickness d of the low refractive index layer is changed within a range of 10 nm<d<50 nm, and the refractive index difference $\Delta n$ is changed within a range of $-0.75<\Delta n<035$. Furthermore, as in Embodiment 1, it is assumed that the phase difference satisfies $\Delta n \times d/\lambda$, and $\Delta n$ denotes the difference between the refractive indices of the low refractive index layer (phase control layer) and the light-emitting layer when the refractive index of the light-emitting layer is taken as reference.

As shown in FIG. 4A to FIG. 4C, light-emitting efficiency rises when the refractive index of the low refractive index layer is lower than the refractive index of the light-emitting layer (when $\Delta n$ is a negative value).

For example, in the case where the light-emitting point S satisfies x=30 nm, the light-emitting efficiency when the low refractive index layer is not provided is approximately 0.4 as shown in FIG. 8. However, as shown in FIG. 4A, by making the refractive index difference $\Delta n$ negative, that is, by making the refractive index of the low refractive index layer lower than the refractive index of the light-emitting layer, the light-emitting efficiency when the low refractive index layer is provided improves beyond 0.4.

Furthermore, in the case where the light-emitting point S satisfies x=100 nm, the light-emitting efficiency when the low refractive index layer is not provided is approximately 0.55 as shown in FIG. 8. However, as shown in FIG. 4B, by making the refractive index difference $\Delta n$ negative, the light-emitting efficiency when the low refractive index layer is provided improves beyond 0.55.

Furthermore, in the case where the light-emitting point S satisfies x=100 nm, the light-emitting efficiency when the low refractive index layer is not provided is approximately 0.68 as shown in FIG. 8. However, as shown in FIG. 4C, by making the refractive index difference $\Delta n$ negative, the light-emitting efficiency when the low refractive index layer is provided improves beyond 0.68.

In this manner, by likewise setting the phase difference ($\Delta n \times d/\lambda$) of the low reference index layer 15 to at most 0 in this Embodiment, light-emitting efficiency can be improved.

Furthermore, as described earlier, it is preferable that the light-emitting efficiency be 80% or higher. Based on FIG. 4A to FIG. 4C, the condition for setting the light-emitting efficiency to 80% or higher in all the cases shown in the figures is that the phase difference be at most minus 0.02. Therefore, when the reflective electrode 11 comprises Ag, it is preferable that the phase difference ($\Delta n \times d/\lambda$) of the low reference index layer 15 be set to at most $-0.02$.

(Modifications)

Modifications of the organic EL device according to this embodiment shall be described below. It should be noted that the configuration in these modifications can also be applied to either of Embodiments 1 or 2 described above.

(Modification 1)

Figure 5:
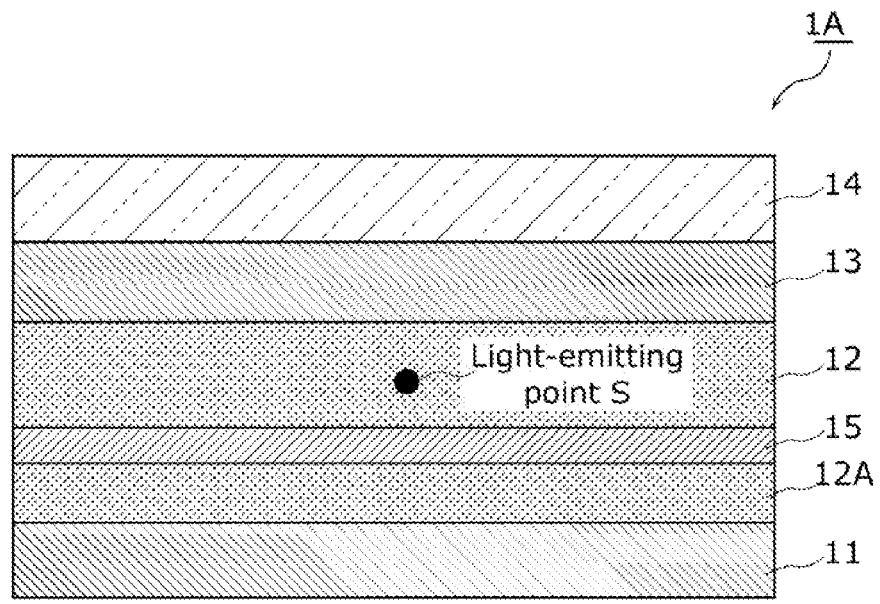
FIG. 5 is a schematic cross-sectional view of a configuration of an organic EL device according to Modification 1.

First, an organic EL device 1A according to Modification 1 shall be described using FIG. 5. FIG. 5 is a schematic cross-sectional view of a configuration of an organic EL device according to Modification 1.

The organic EL devices according to Embodiments 1 and 2 and the organic EL device according to this modification are different in terms of the position of the low refractive index layer 15. Whereas the low refractive index layer 15 in the organic EL devices according to Embodiments 1 and 2 is provided between the reflective electrode 11 and the organic layer 12, the low refractive index layer 15 in this modification is provided between two organic layers.

Specifically, as shown in FIG. 5, the organic EL device 1A according to this modification is configured by stacking the reflective electrode 11, an organic layer (first organic layer) 12A, the low refractive index layer 15, the organic layer (second organic layer) 12, the transparent electrode 13, and the transparent substrate 14, in the stated order. Furthermore, in this modification, the low refractive index layer 15 is provided between the first organic layer (organic layer 12A) on the reflective electrode 11-side and the second organic layer (organic layer 12) on the transparent electrode 13-side.

In other words, compared to Embodiments 1 and 2, in the organic EL device 1A according to this modification, the organic layer 12A is additionally provided between the reflective electrode 11 and the low refractive index layer 15. The organic layer 12A is configured of a carrier transport layer which transports electrons or holes or a carrier injection layer which injects electrons or holes, and does not include a light-emitting layer Since the reflective electrode 11 in this modification is a cathode, the organic layer 12A is configured of one of an electrode injection layer and an electrode transport layer or both. It should be noted that, for the material of the organic layer 12A, the material of the carrier transport layer or the carrier injection layer described above can be used.

As described above, the organic EL device 1A according to this modification is capable of producing the same advantageous effect as that in Embodiments 1 and 2, and is capable of suppressing the effects of surface plasmons using the low refractive index layer 15 and thereby improving light-emitting efficiency. Furthermore, it is confirmed that approximately the same advantageous results can be obtained regardless of the place at which the low refractive index layer is disposed in between the light-emitting point S and the reflective electrode 11. Therefore, the low refractive index layer 15 may be disposed to come into contact with the light-emitting layer, and may be disposed to come into contact with the reflective electrode 11, for example.

(Modification 2)

Next, an organic EL device according to Modification 2 shall be described.

In the organic EL device, apart from the loss caused by surface plasmons, there is total reflection loss in an interface where the refractive index changes, and this becomes a factor which significantly lowers device efficiency. In view of this, a light-extracting structure such as a diffraction grating, a light-diffusing layer, a microlens, a pyramid structure, or the like, may be provided in the organic EL device described above. As positions of such a light-extracting structure, there are, for example, the interface between the transparent substrate 14 and the air layer, the interface between the transparent substrate 14 and the transparent electrode 13, and so on. Furthermore, such light extracting structures may be provided as a structure separate from the respective structural elements of the organic EL device shown in FIG. 1 and so on, and may be formed as an integrated configuration in part of the respective structural elements.

As described above, since the organic EL device according to this modification is capable of improving the light extraction effect by way of the light extracting structure, light-emitting efficiency can be further improved compared to Embodiments 1 and 2.

Other Modifications

Although organic EL devices and fabricating methods thereof have been described based on the embodiments and modifications thus far, the present disclosure is not limited to such embodiments and modifications. For example, forms obtainable by performing various modifications on the respective embodiments and modifications that may be conceived by a person of ordinary skill in the art as well as forms realized by arbitrarily combining the structural elements and functions in the respective embodiments and modifications without departing from the scope of the teachings of the present disclosure are included in the present disclosure.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

Organic EL devices according to one or more exemplary embodiments enclosed herein can be widely used in light-emitting apparatuses, and the like, such as backlights for flat-panel displays and liquid-crystal display apparatuses as well as light sources for lighting.

The invention claimed is:

1. An organic electroluminescence (EL) device comprising:
a reflective electrode;
a transparent electrode opposite the reflective electrode;
a light-emitting layer between the reflective electrode and the transparent electrode; and
a low refractive index layer between the reflective electrode and the light-emitting layer,
wherein the low refractive index layer has a function of transporting or injecting electrons or holes, and has a refractive index lower than a refractive index of the light-emitting layer,
a distance between a top surface of the reflective electrode and a central light-emitting position of the light-emitting layer is 300 nm or less,
the reflective electrode comprises Al, and
$\Delta n \times d/\lambda \leq -0.009$ is satisfied where:
$\lambda$ denotes a central light-emitting wavelength of light generated in the light-emitting layer;
$\Delta n$ denotes a difference between the refractive index of the low refractive index layer and the refractive index of the light-emitting layer when the refractive index of the light-emitting layer is used as reference; and
d denotes a thickness of the low refractive index layer,
wherein the light-emitting layer emits light when voltage is applied to the reflective electrode and the transparent electrode.

2. An organic electroluminescence (EL) device comprising:
a reflective electrode;
a transparent electrode opposite the reflective electrode;
a light-emitting layer between the reflective electrode and the transparent electrode; and
a low refractive index layer between the reflective electrode and the light-emitting layer,
wherein the low refractive index layer has a function of transporting or injecting electrons or holes, and has a refractive index lower than a refractive index of the light-emitting layer,
a distance between a top surface of the reflective electrode and a central light-emitting position of the light-emitting layer is 300 nm or less,
the reflective electrode comprises Ag, and
$\Delta n \times d/\lambda \leq -0.02$ is satisfied where:
$\lambda$ denotes a central light-emitting wavelength of light generated in the light-emitting layer;
$\Delta n$ denotes a difference between the refractive index of the low refractive index layer and the refractive index of the light-emitting layer when the refractive index of the light-emitting layer is used as reference; and
d denotes a thickness of the low refractive index layer,
wherein the light-emitting layer emits light when voltage is applied to the reflective electrode and the transparent electrode.

3. The organic EL device according to claim 1, further comprising
an organic layer between the reflective electrode and the low refractive index layer, the organic layer having a function of transporting or injecting electrons or holes.

4. The organic EL device according to claim 1,
wherein the low refractive index layer is in contact with the light-emitting layer.

5. The organic EL device according to claim 1 further comprising one of the following, in an interface at which a refractive index in the organic EL device changes:
a diffraction grating;
a light-diffusing layer;
a microlens; and
a pyramid structure.

6. The organic EL device according to claim 1,
wherein the low refractive index layer comprises (i) a material having a function of transporting or injecting electrons or holes and (ii) nanoparticles which are mixed into the material.

7. The organic EL device according to claim 1,
wherein the low refractive index layer includes:
a nanoparticle layer comprising nanoparticles; and
a function layer above the nanoparticle layer, the function layer comprising a material having a function of transporting or injecting electrons or holes.

8. The organic EL device according to claim 1,
wherein the low refractive index layer includes:
two function layers each having a function of transporting or injecting electrons or holes; and
a nanoparticle layer between the two function layers, the nanoparticle layer comprising nanoparticles.

9. The organic EL device according to claim 6,
wherein the nanoparticles have a grain size less than or equal to the thickness of the low refractive index layer.

10. The organic EL device according to claim 6,
wherein the nanoparticles are porous particles.

11. The organic EL device according to claim 6,
wherein the nanoparticles have a refractive index of 1.5 or less.

* * * * *